(12) United States Patent
Hashimoto et al.

(10) Patent No.: US 10,978,820 B2
(45) Date of Patent: Apr. 13, 2021

(54) IC SOCKET WITH CONTACTS HAVING A RETAINED PORTION

(71) Applicant: Tyco Electronics Japan G.K., Kawasaki (JP)

(72) Inventors: Shinichi Hashimoto, Kawasaki (JP); Masayuki Aizawa, Kawasaki (JP); Hiroshi Shirai, Kawasaki (JP); Naoki Hashimoto, Kawasaki (JP)

(73) Assignee: Tyco Electronics Japan G.K., Kawasaki (JP)

( * ) Notice: Subject to any disclaimer, the term of this patent is extended or adjusted under 35 U.S.C. 154(b) by 0 days.

(21) Appl. No.: 16/682,391

(22) Filed: Nov. 13, 2019

(65) Prior Publication Data

US 2020/0153140 A1    May 14, 2020

(30) Foreign Application Priority Data

Nov. 13, 2018  (JP) .............................. JP2018-212783
Mar. 29, 2019  (JP) .............................. JP2019-065786

(51) Int. Cl.
| | |
|---|---|
| *H01R 13/11* | (2006.01) |
| *H01R 13/24* | (2006.01) |
| *H01R 13/15* | (2006.01) |
| *H01R 13/05* | (2006.01) |

(52) U.S. Cl.
CPC .......... *H01R 13/11* (2013.01); *H01R 13/052* (2013.01); *H01R 13/15* (2013.01); *H01R 13/2464* (2013.01)

(58) Field of Classification Search
CPC .......... H01R 13/11; H01R 13/57; H01R 9/96; H01R 13/052; H01R 13/15; H01R 13/2464

USPC .......................................... 439/66, 591, 862
See application file for complete search history.

(56) References Cited

U.S. PATENT DOCUMENTS

| | | | | |
|---|---|---|---|---|
| 5,860,838 | A  * | 1/1999 | Kaneko ................ | H01R 13/112 |
| | | | | 439/857 |
| 6,957,964 | B2 * | 10/2005 | Chiang .............. | H01R 13/2435 |
| | | | | 439/66 |
| 7,429,200 | B2 * | 9/2008 | Lee ..................... | H01R 13/2442 |
| | | | | 439/862 |
| 7,527,536 | B2 * | 5/2009 | Chiang ................ | H05K 7/1069 |
| | | | | 439/884 |

(Continued)

FOREIGN PATENT DOCUMENTS

| JP | 10228969 A | 8/1998 |
|---|---|---|
| JP | 200021528 A | 1/2000 |

(Continued)

*Primary Examiner* — Abdullah A Riyami
*Assistant Examiner* — Marcus E Harcum
(74) *Attorney, Agent, or Firm* — Barley Snyder (57) ABSTRACT

An integrated circuit socket includes a housing having a flat plate portion and a plurality of contacts disposed in the housing. The contacts each have a contact beam projecting outwardly from a first surface of the housing and a retained portion disposed in a passageway in the flat plate portion. The contact beam extends from the retained portion. The retained portion has a base portion with a flat-plate shape and a pair of side portions extending at an angle with respect to the base portion on a pair of opposite sides of the base portion. A cross-section of the retained portion parallel to the first surface has a U-shape.

12 Claims, 13 Drawing Sheets

(56) References Cited

U.S. PATENT DOCUMENTS

| | | | | |
|---|---|---|---|---|
| 7,563,105 B2* | 7/2009 | Liu | | H01R 13/2492 |
| | | | | 439/66 |
| 7,857,632 B2* | 12/2010 | Liu | | H01R 13/2492 |
| | | | | 439/66 |
| 8,454,373 B2* | 6/2013 | Cheng | | H01R 12/57 |
| | | | | 439/66 |
| 10,398,051 B2* | 8/2019 | Kawabata | | G01R 1/0466 |
| 10,431,912 B2* | 10/2019 | Murtagian | | H01R 12/7076 |
| 10,651,584 B2* | 5/2020 | Hsu | | H01R 13/40 |
| 10,658,775 B2* | 5/2020 | Lin | | H01R 12/721 |
| 2007/0015377 A1* | 1/2007 | Lee | | H01R 13/6464 |
| | | | | 439/66 |
| 2009/0042412 A1* | 2/2009 | Hashimoto | | H05K 7/1069 |
| | | | | 439/66 |
| 2009/0156021 A1* | 6/2009 | Polnyi | | H01R 12/57 |
| | | | | 439/66 |
| 2010/0093191 A1* | 4/2010 | Yuan | | H01R 12/57 |
| | | | | 439/66 |
| 2012/0028502 A1* | 2/2012 | Yeh | | H05K 3/3426 |
| | | | | 439/626 |
| 2012/0178306 A1* | 7/2012 | Ju | | H05K 7/1069 |
| | | | | 439/660 |
| 2014/0162472 A1* | 6/2014 | Walden | | H01R 12/714 |
| | | | | 439/66 |
| 2018/0351277 A1* | 12/2018 | Beaman | | H01R 12/57 |
| 2019/0140382 A1* | 5/2019 | Ju | | H01R 12/7076 |

FOREIGN PATENT DOCUMENTS

| | | |
|---|---|---|
| JP | 200293828 A | 3/2002 |
| JP | 2004152495 A | 5/2004 |
| JP | 200748576 A | 2/2007 |
| JP | 2007109520 A | 4/2007 |
| JP | 20147039 A | 1/2014 |
| JP | 2016503946 A | 2/2016 |

* cited by examiner

IC SOCKET WITH CONTACTS HAVING A RETAINED PORTION

CROSS-REFERENCE TO RELATED APPLICATIONS

This application claims the benefit of the filing date under 35 U.S.C. § 119(a)-(d) of Japanese Patent Application No. 2018-212783, filed on Nov. 13, 2018, and Japanese Patent Application No. 2019-065786, filed on Mar. 29, 2019.

FIELD OF THE INVENTION

The present invention relates to a socket and, more particularly, to an integrated circuit socket.

BACKGROUND

Integrated circuits (IC) have increasingly been subjected to large-scale integration; some ICs have 4000 to 9000 pads electrically connected to external portions. Contacts of a number equal to the number of the pads are correspondingly arrayed on such an IC socket. For example, Japanese Patent Application No. 2007-109520A discloses an IC socket including a housing and a large number of arrayed contacts. In recent years, ICs have begun processing high-speed signals such as a signal at 100 GHz. Therefore, it has also been demanded that IC sockets include contacts that can transmit such high-speed signals.

Each contact of an IC socket disclosed in JP 2007-109520A includes a retained portion, inserted into a contact retaining hole disposed in a housing, and a resilient arm protruding from the housing. The retained portion of the contact has a flat-plate shape. Such a contact is influenced by contacts arrayed adjacently to the contact, and therefore, it is necessary to evaluate signal transmission performance in consideration of the influence.

In a case in which a retained portion has a flat-plate shape, a distance between the portions to be retained of the contact and a neighboring contact arrayed adjacently to the contact in the direction of extension of the flat plate, and a distance between the portions to be retained of the contact and a neighboring contact in a direction intersecting the extension of the flat plate differ greatly from each other. Therefore, the level of the influence of a contact arrayed adjacently to the contact vary according to a direction in which the contacts are adjacent to each other. Such variations in the level of the influence according to the direction lead to the degradation of signal transmission performance. Accordingly, the contact of JP 2007-109520A transmits a high-speed signal at 100 GHz with great difficulty.

SUMMARY

An integrated circuit socket includes a housing having a flat plate portion and a plurality of contacts disposed in the housing. The contacts each have a contact beam projecting outwardly from a first surface of the housing and a retained portion disposed in a passageway in the flat plate portion. The contact beam extends from the retained portion. The retained portion has a base portion with a flat-plate shape and a pair of side portions extending at an angle with respect to the base portion on a pair of opposite sides of the base portion. A cross-section of the retained portion parallel to the first surface has a U-shape.

BRIEF DESCRIPTION OF THE DRAWINGS

The invention will now be described by way of example with reference to the accompanying Figures, of which.

DETAILED DESCRIPTION OF THE EMBODIMENT(S)

Exemplary embodiments of the present disclosure will be described hereinafter in detail with reference to the attached drawings, wherein like reference numerals refer to like elements. The present disclosure may, however, be embodied in many different forms and should not be construed as being limited to the embodiment set forth herein; rather, these embodiments are provided so that the present disclosure will convey the concept of the disclosure to those skilled in the art.

Figure 1:
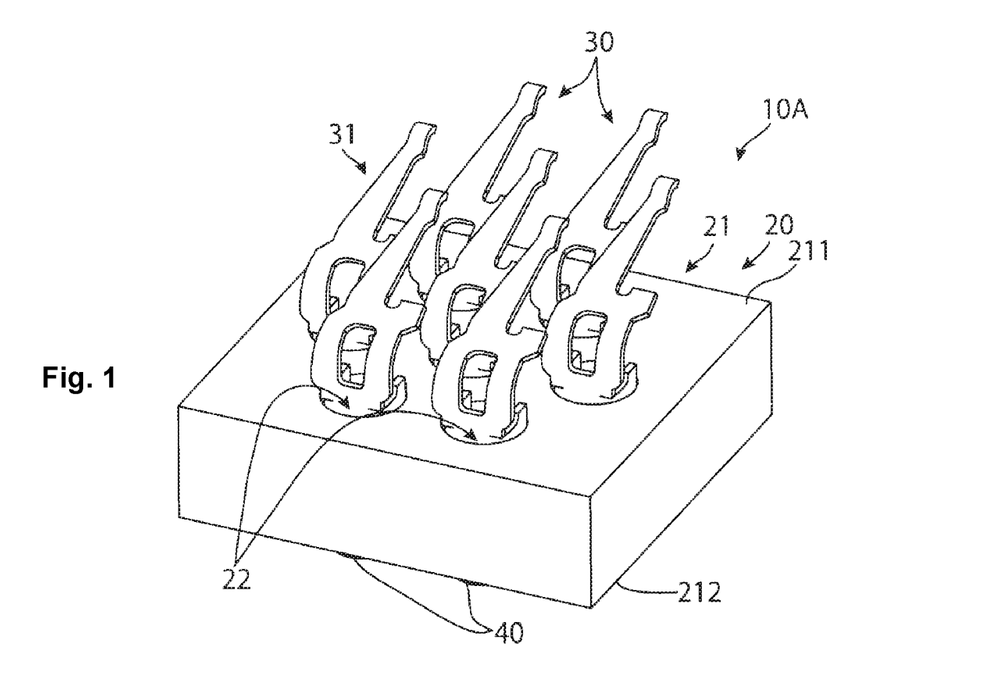
FIG. 1 is a perspective view of a housing and a plurality of contacts in an IC socket according to an embodiment.

A housing 20 and a plurality of contacts 30 in an IC socket 10A according to an embodiment are shown in FIG. 1. The housing 20 of the IC socket 10A, as shown in FIG. 1, includes a flat plate portion 21, and, for example, as many as 4000 contacts 30 are arrayed in the flat plate portion 21. Each of the contacts 30 has a same shape. Accordingly, only a small part of the flat plate portion 21 of the housing 20 and a few contacts 30 are shown in FIG. 1, but are sufficient for a description.

The IC socket 10A includes the housing 20 including the flat plate portion 21, and the plurality of contacts 30, as shown in FIG. 1. An IC (not shown) is positioned at a position facing a first surface 211 of the flat plate portion 21. A large number of passageways 22 extending through the first surface 211 and a second face 212 are formed in the flat plate portion 21 of the housing 20. Each contact 30 is inserted into one passageway 22 and retained in the housing 20. Each contact 30 includes a contact beam 31 outwardly protruding from the first surface 211. When an IC is positioned facing the first surface 211, the contact beams 31 come into contact with the pad (not illustrated) of the IC and connect electrically with the IC. In FIG. 1, a plurality of solder balls 40, also shown in FIG. 2A, are fixed to the contacts 30 in a side closer to the second face 212.

Figure 2A:
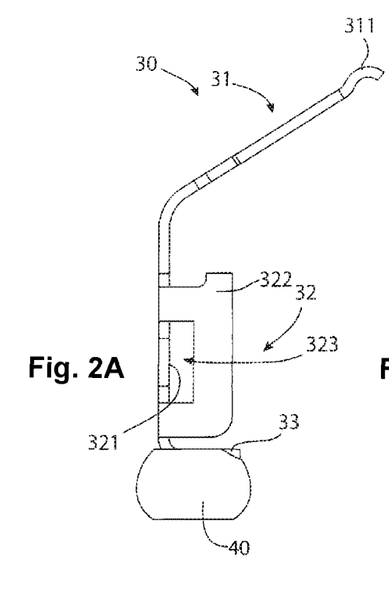
FIG. 2A is a side view of a contact of FIG. 1 with a solder ball.
Figure 2B:
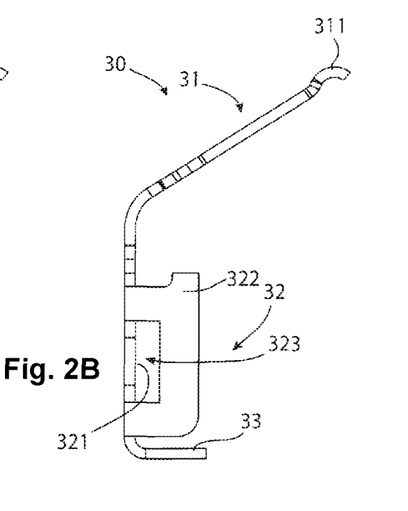
FIG. 2B is a side view of the contact of FIG. 1.
Figure 2C:
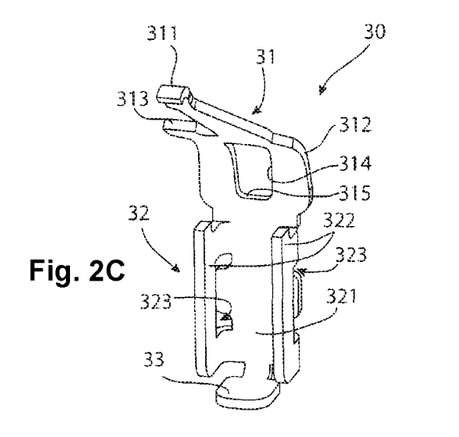
FIG. 2C is a perspective view of the contact of FIG. 1.

The contact 30 is shown with a shape after the contact 30 has been inserted into the passageway 22 in FIGS. 2A-2C. The contact 30 includes a retained portion 32 and a solder ball retention portion 33 as well as a contact beam 31. The solder ball retention portion 33 retains the solder ball 40, as shown in FIG. 2A.

The retained portion 32 is inserted into the passageway 22 disposed in the flat plate portion 21 of the housing 20, and retained in the flat plate portion 21. The retained portion 32, as shown in FIGS. 2A-2C, includes a base portion 321 having a flat-plate shape and a pair of side portions 322. The pair of side portions 322 extend at an angle with respect to the base portion 321 on each of both sides of the base portion 321. As a result, a cross section of the base portion 321 and the pair of the side portions 322 in the retained portion 32 in a direction parallel to the first surface 211 of the flat plate portion 21 of the housing 20 has a roughly U-shape. In the retained portion 32 in the shown embodiment, a slit 323 is formed between the base portion 321 and each of the pair of the side portions 322.

As shown in FIGS. 2A-2C, the contact beam 31 of the contact 30 extends, from the base portion 321 through a wide portion 312, obliquely with respect to the first surface 211 of the flat plate portion 21 of the housing 20. The contact beam 31 has a width decreasing approaching the obliquely extending end thereof, and includes a contact portion 311, which comes into contact with an IC, in the leading end. The wide portion 312 includes a carrier-cut portion 313 at a position adjacent to the contact beam 31. The carrier-cut portion 313 is disposed in the wide portion 312 with relatively high rigidity, and therefore facilitates breaking-off of a carrier (not illustrated). An opening 314 which is generally rectangular is formed in the center of the wide portion 312. A lower edge 315 of the opening 314 is a surface pressed by a press-fitting jig (not shown) when the contact 30 is press-fitted into the passageway 22.

Figure 3:
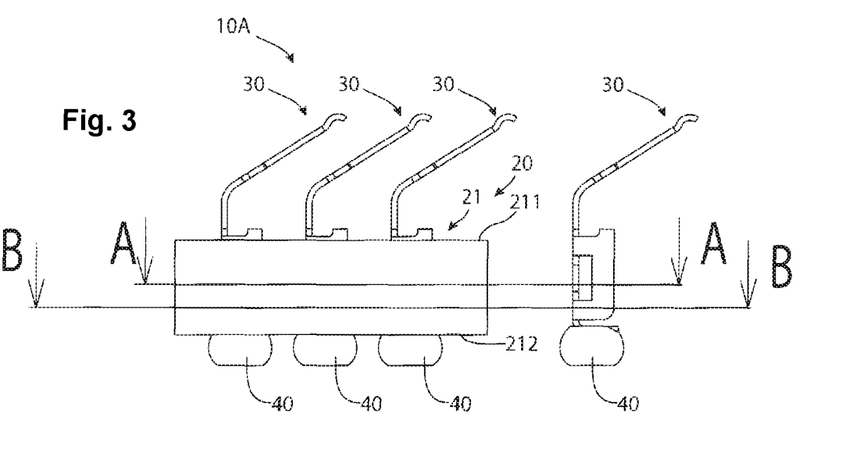
FIG. 3 is a side view of the IC socket of FIG. 1.

A contact 30 independent of the housing 20 is illustrated in FIG. 3. However, this is intended to illustrate a cross-section portion of the contact 30, and the contact 30 independent of the housing 20 is not shown in FIGS. 4A and 4B. In FIGS. 5A and 5B, the contact 30 independent of the housing 20 is not illustrated either.

The pair of the side portions 322, of the retained portion 32 of the contact 30 shown in FIGS. 2A-2C, extend in parallel with each other in the same direction. However, this is a shape after the pair of side portions 322 have been pressed in a direction, in which the side portions 322 approach each other, by the inner wall surface of the passageway 22, to elastically deform the side portions 322. Before the insertion into the passageway 22, these side portions 322 in the pair have such a shape that the ends 322a of the side portions 322 broaden from each other in a direction in which the leading ends 322a are increasingly distant from each other, in comparison with those shown in FIGS. 4A-5B.

When the retained portion 32 of the contact 30 is inserted into the passageway 22, the side portions 322 are pressed in the direction, in which the side portions 322 approach each other, by the inner wall surface of the passageway 22, to elastically deform the side portions 322. This elastic deformation causes corners of the ends 322a of the side portions 322 and corners of both ends 321a of the base portion 321, as shown in FIGS. 4A-5B, to come into contact with four points in total of the inner wall surface of the passageway 22, to stably retain the retained portion 32 in the passageway 22.

Figure 4A:
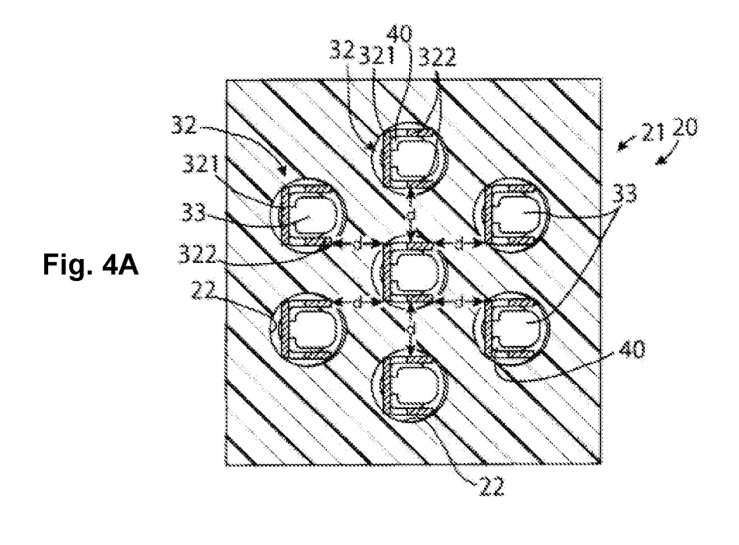
FIG. 4A is a sectional top view of the IC socket, taken along line A-A of FIG. 3.
Figure 4B:
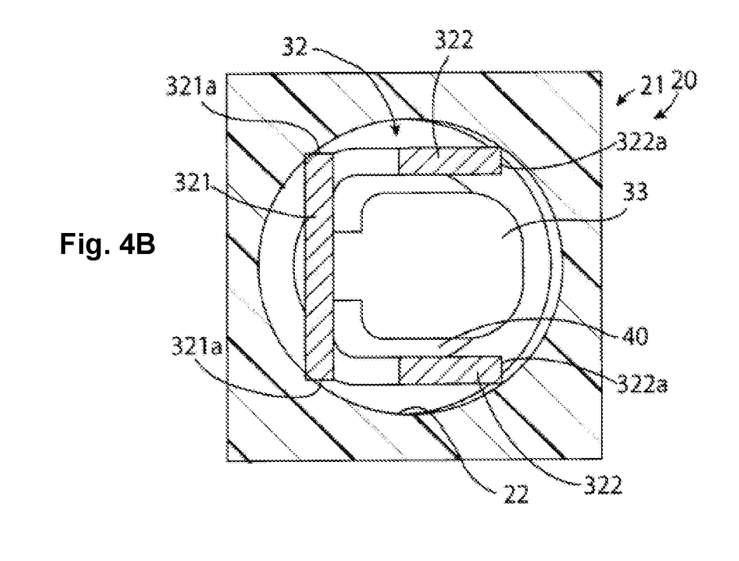
FIG. 4B is an enlarged portion of FIG. 4A.
Figure 5A:
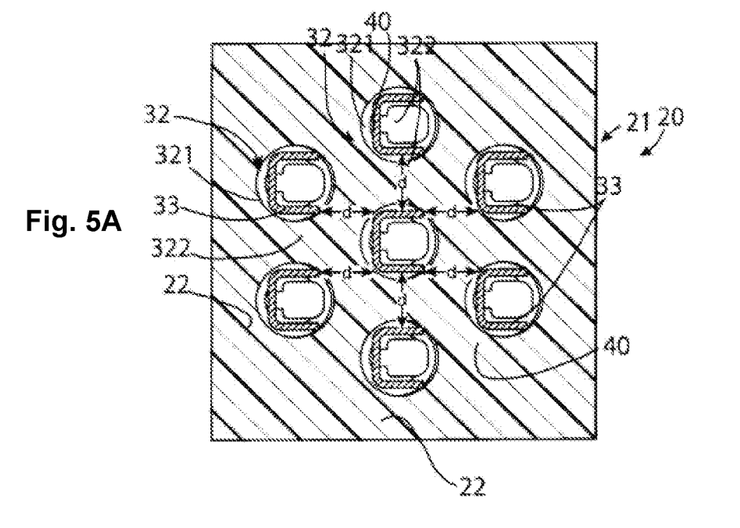
FIG. 5A is a sectional top view of the IC socket, taken along line B-B of FIG. 3.
Figure 5B:
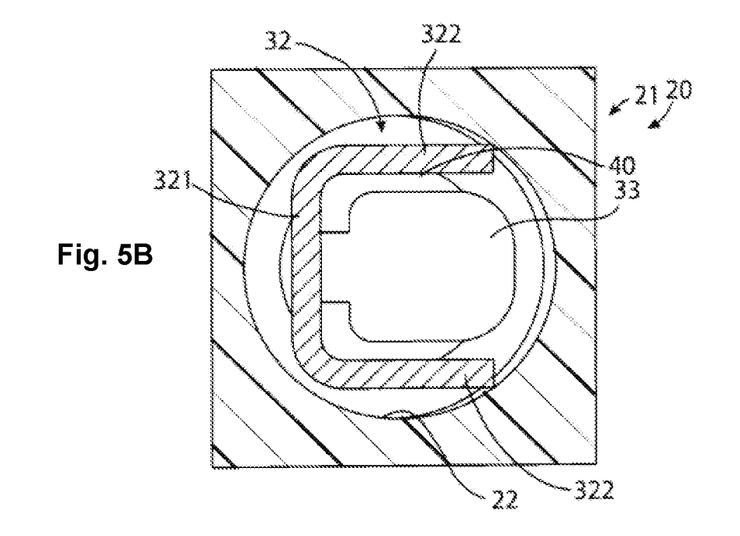
FIG. 5B is an enlarged portion of FIG. 5A.

The formation of the retained portion 32 in a U-shape allows distances d, shown in FIGS. 4A and 5A, from surrounding existing contacts 30 to be uniform regardless of directions, in comparison with a contact including a retained portion having a merely flat-plate shape, thereby enabling high-speed signal transmission.

The retained portion 32 of the contact 30 includes the slit 323 having a roughly U-shape between the base portion 321 and each of the pair of side portions 322. The slit 323 corresponds to an example of a first slit according to an embodiment. The slit 323 allows adjustment of the spring force of the elastic deformation of the side portions 322. Moreover, the formation of the slit 323 allows edges to be formed on the corners of both the ends 321a of the base portion 321, and the edges come into contact with the inner wall surface of the passageway 22. As described above, the formation of the slit 323 allows the retained portion 32 to be still more stably retained in the passageway 22.

Another embodiment will now be described with reference to FIGS. 6A-9D. In the description of the second embodiment, an element corresponding to each element included in the IC socket 10A of the embodiment of FIGS. 1-5B is denoted by the same reference character even if the elements differ in shape or the like.

Figure 6A:
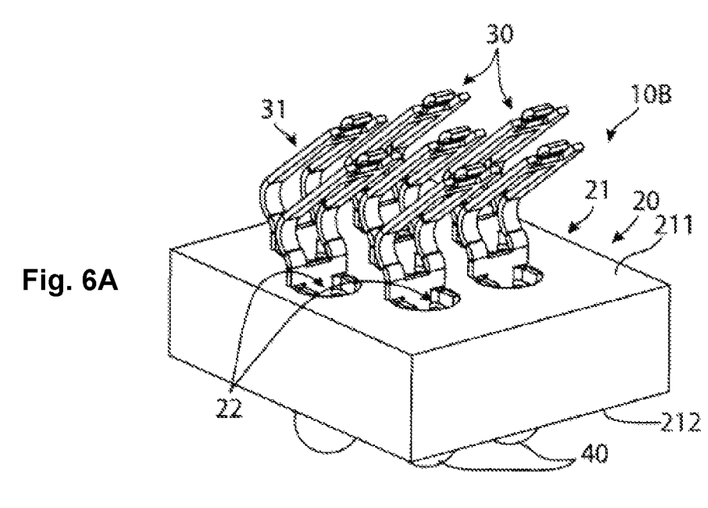
FIG. 6A is a perspective view of an IC socket according to another embodiment.
Figure 6B:
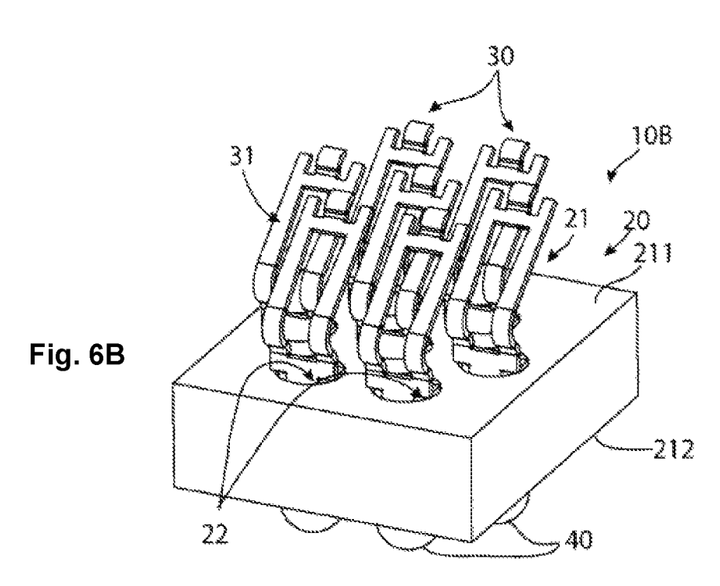
FIG. 6B is another perspective view of the IC socket of FIG. 6A.

The housing 20 of an IC socket 10B, as shown in FIGS. 6A and 6B, includes a flat plate portion 21, and, for example, as many as 4000 contacts 30 arrayed in the flat plate portion 21. Each of the contacts 30 has a same shape. Accordingly, only a small part of the flat plate portion 21 of the housing 20 and a few contacts 30 are shown in FIGS. 6A and 6B, yet are sufficient for a description.

The IC socket 10B includes the housing 20, including the flat plate portion 21, and the plural contacts 30, as shown in FIGS. 6A and 6B. An IC (not illustrated) is positioned facing a first surface 211 of the flat plate portion 21. A large number of passageways 22 passing through the first surface 211 and a second face 212 are formed in the flat plate portion 21 of the housing 20. Each contact 30 is inserted into one passageway 22 and retained in the housing 20. Each contact 30 includes a contact beam 31 outwardly protruding from the first surface 211. When an IC is positioned at the position facing the first surface 211, the contact beams 31 is in contact with the pad (not illustrated) of the IC and connects electrically with the IC. In FIG. 6, solder balls 40 are fixed to the contacts 30 in a side closer to the second face 212.

FIGS. 7A-7D illustrate the contact 30 after the contact 30 has been inserted into the passageway 22. The contact 30 includes a retained portion 32, a solder ball retention portion 33, and a contact beam 31. The solder ball retention portion 33 retains the solder ball 40, as shown in FIGS. 6A and 6B. The retained portion 32 is inserted into the passageway 22 disposed in the flat plate portion 21 of the housing 20, and retained in the flat plate portion 21. The contact beam 31 extends from the retained portion 32 inserted into the passageway 22.

As shown in FIGS. 7A-7D, the retained portion 32 includes a base portion 321 having a flat-plate shape, and a pair of side portions 322. The pair of side portions 322 extend at an angle with respect to the base portion 321 on each of both sides of the base portion 321. As a result, a cross section of the base portion 321 and the side portions in the pair in the retained portion 32 in a direction parallel to the first surface 211 of the flat plate portion 21 of the housing 20 has a roughly U-shape. In the retained portion 32, a slit 323 is formed between the base portion 321 and each of the pair of side portions 322.

Figure 7A:
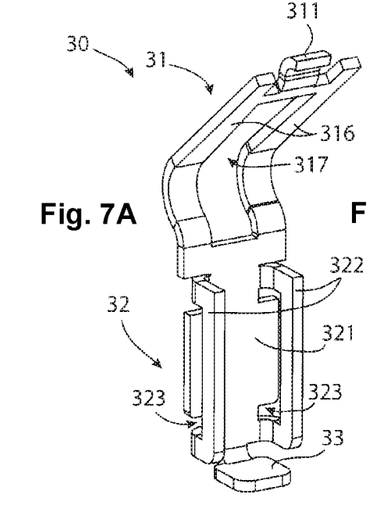
FIG. 7A is a perspective view of a contact of the IC socket of FIG. 6A.
Figure 7B:
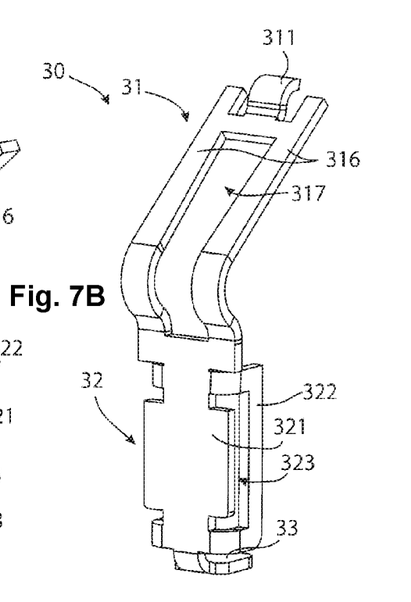
FIG. 7B is a perspective view of the contact of FIG. 7A.
Figure 7C:
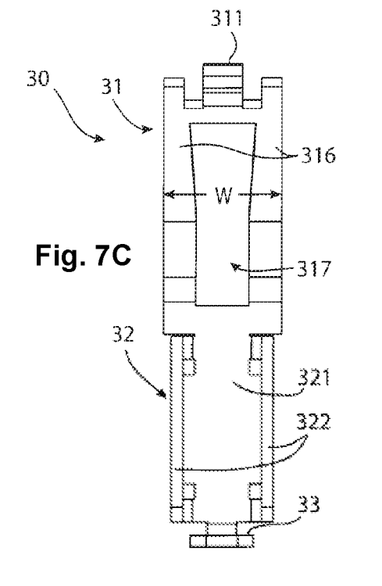
FIG. 7C is a front view of the contact of FIG. 7A.
Figure 7D:
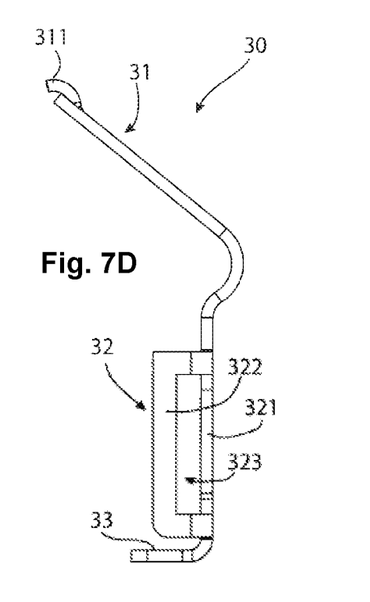
FIG. 7D is a side view of the contact of FIG. 7A.

The contact beam 31 extends obliquely with respect to the first surface 211 of the flat plate portion 21 of the housing 20. The contact beam 31, as shown in FIGS. 7A-7D, includes a contact portion 311, which comes into contact with an IC, in an obliquely extending leading end. In the contact beam 31, a portion excluding the leading end including the contact portion 311 has a uniform width W, as shown in FIG. 7C. The contact beam 31 having the uniform width W enables high-speed signal transmission. The contact beam 31 includes two sub-beams 316. The two sub-beams 316, between which a slit 317 is sandwiched, extend in parallel with each other. The slit 317 corresponds to an example of a second slit. When the contact beam 31 includes the two sub-beams 316 between the slit 317 is sandwiched, the spring property of the contact beam 31 can be adequately adjusted. Because high-speed signal transmission performance is substantially determined by the width W of the entire contact beam 31, the inclusion of the two sub-beams 316 in the contact beam 31 does not greatly influence the high-speed signal transmission performance.

FIGS. 7A-7D show the contact 30 with a shape after the contact 30 has been inserted into the passageway 22. The pair of side portions 322, of the retained portion 32 of the contact 30 shown in FIGS. 7A-7D, extend in parallel with each other in the same direction as viewed from the base portion 321. However, this is a shape after the pair of side portions 322 have been pressed in a direction, in which the side portions 322 approach each other, by the inner wall surface of the passageway 22, to elastically deform the side portions 322. Before the insertion into the passageway 22, these side portions 322 in the pair have such a shape that the ends 322a of the side portions 322 broaden from each other in a direction in which the leading ends 322a are increasingly distant from each other, in comparison with those illustrated in FIGS. 4A-5B.

Figure 8A:
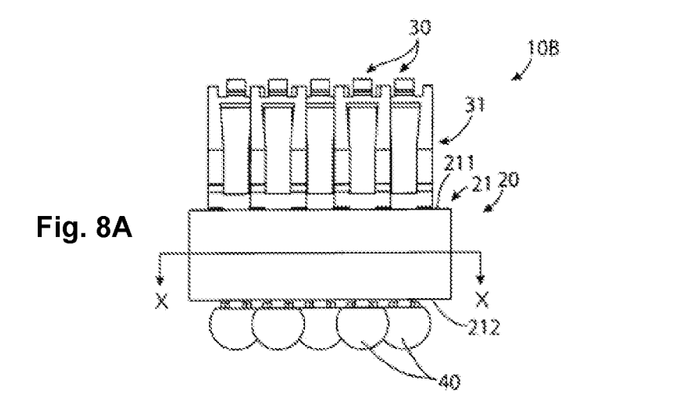
FIG. 8A is a side view of the IC socket of FIG. 6A.
Figure 8B:
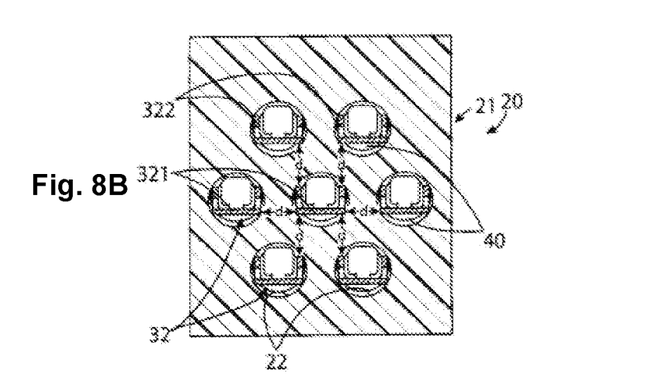
FIG. 8B is a sectional top view of the IC socket, taken along line X-X of FIG. 8A.
Figure 8C:
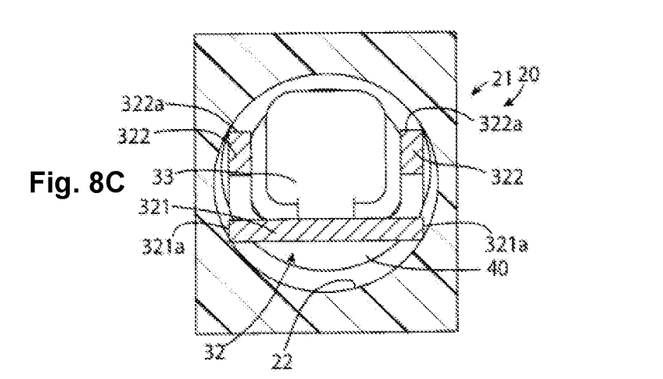
FIG. 8C is an enlarged portion of FIG. 8B.
Figure 9A:
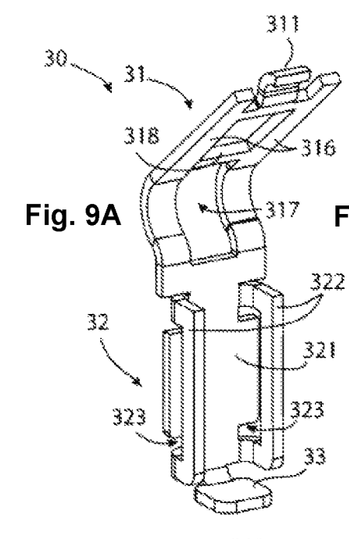
FIG. 9A is a perspective view of a contact of the IC socket of FIG. 6A according to another embodiment.
Figure 9B:
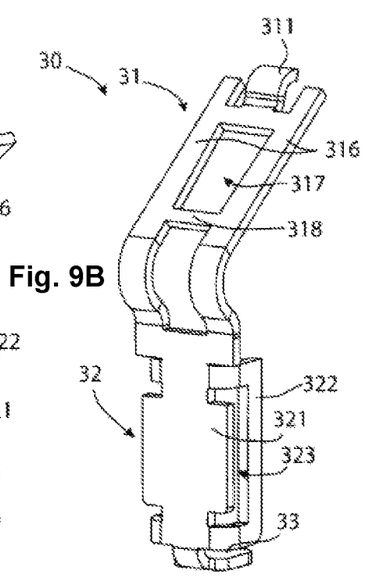
FIG. 9B is a perspective view of the contact of FIG. 9A.
Figure 9C:
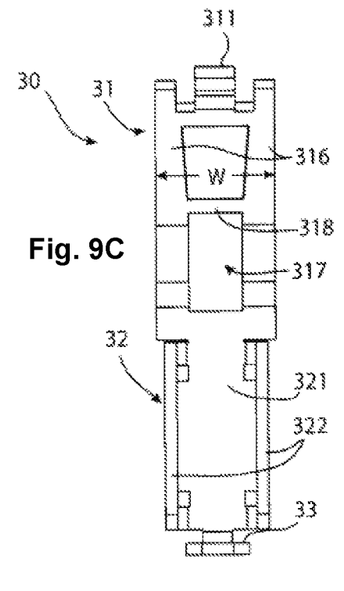
FIG. 9C is a front view of the contact of FIG. 9A.
Figure 9D:
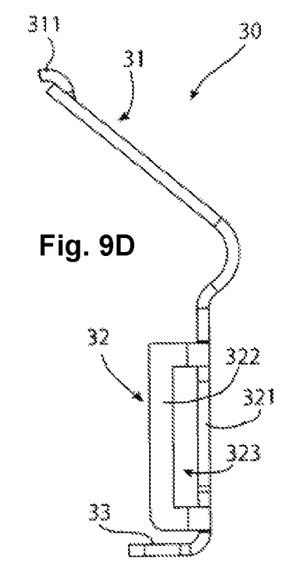
FIG. 9D is a side view of the contact of FIG. 9A.

When the retained portion 32 of the contact 30 is inserted into the passageway 22, as shown in FIGS. 8A-8C, the side portions 322 are pressed in the direction in which the side portions 322 approach each other by the inner wall surface of the passageway 22, to elastically deform the side portions 322. This elastic deformation causes corners of the ends 322a of the side portions 322 and corners of both ends 321a of the base portion 321 to come into contact with four points in total of the inner wall surface of the passageway 22, as shown in FIGS. 8B and 8C, to stably retain the retained portion 32 in the passageway 22. Moreover, the formation of the retained portion 32 to roughly have a U-shape allows distances d from surroundingly existing contacts 30 to be uniform regardless of directions, in comparison with a contact including a retained portion having a merely flat-plate shape, to enable high-speed signal transmission.

The retained portion 32 of the contact 30 includes the slit 323 having a generally U-shape between the base portion 321 and each of the pair of side portions 322. The slit 323 corresponds to an example of the first slit. The formation of the slit 323 allows adjustment of the spring force of the elastic deformation of the side portions 322. Moreover, the formation of the slit 323 allows edges to be formed on the corners of both the ends 321a of the base portion 321, and the edges come into contact with the inner wall surface of the passageway 22. As described above, the formation of the slit 323 allows the retained portion 32 to be still more stably retained in the passageway 22.

A crossbeam 318 that divides a slit 317 disposed in a contact beam 31 and links sub-beams 316 is disposed in a contact 30 shown in FIGS. 9A-9D. The two sub-beams 316 extend for a length. The contact beam 31 may be subjected to deformation varying the width W thereof by being pressed by a positioned IC, depending on the material, thickness, or the like of the contact 30. A variation in the width W of the contact beam 31 results in a change in signal transmission performance. Thus, when the width W of the contact beam 31 may be varied, the crossbeam 318 may be disposed as shown in FIGS. 9A-9D. Because high-speed signal transmission performance is substantially determined by the width W of the entire contact beam 32 as described above, even the disposition of the crossbeam 318 hardly influences the high-speed signal transmission performance.

Although the slits 323 are disposed in the retained portion 32 in the first embodiment, second embodiment, and alternative example thereof, described above, the retained portion 32 need not include the slits 323. In such a case, round-cornered portions contiguous to the side portions 322, rather than the edges, in both ends of the base portion 321 of the retained portion 32 come into contact with the inner wall surface of the passageway 22 of the housing 20.

Another embodiment will now be described in greater detail with reference to FIGS. 10A-13B. The contact 30 includes a contact beam 31, a retained portion 32, and a solder ball retention portion 33. The solder ball retention portion 33 retains a solder ball 40, as shown in FIG. 11.

Figure 10A:
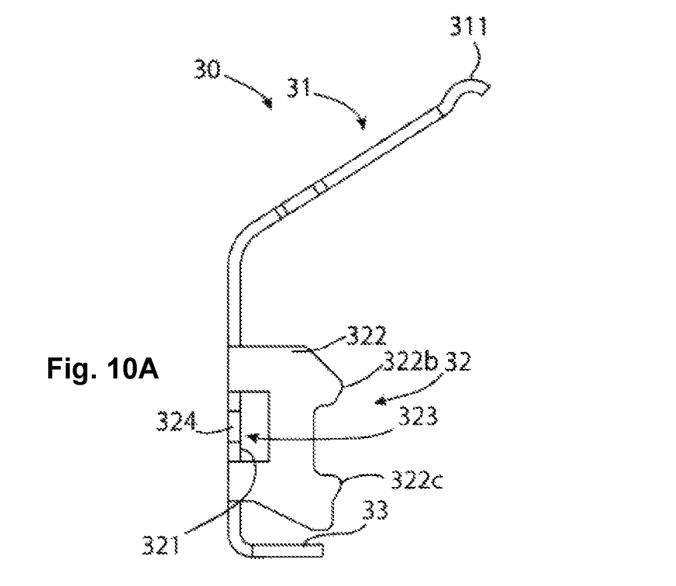
FIG. 10A is a side view of a contact of an IC socket according to another embodiment.
Figure 10B:
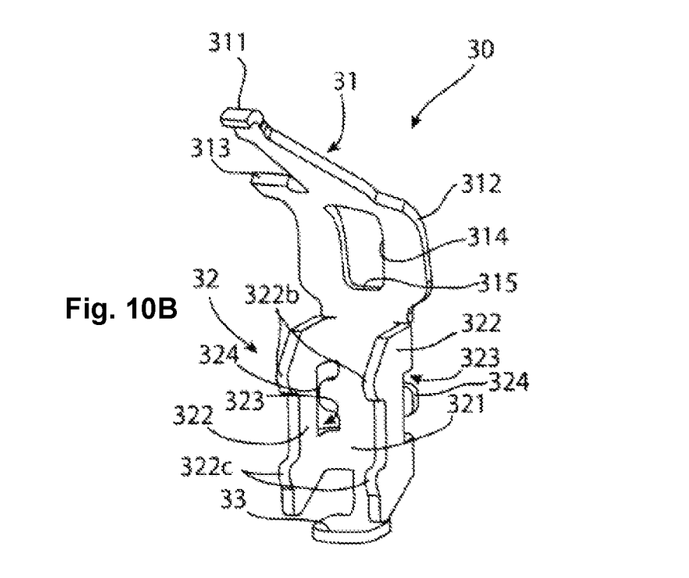
FIG. 10B is a perspective view of the contact of FIG. 10A.
Figure 11:
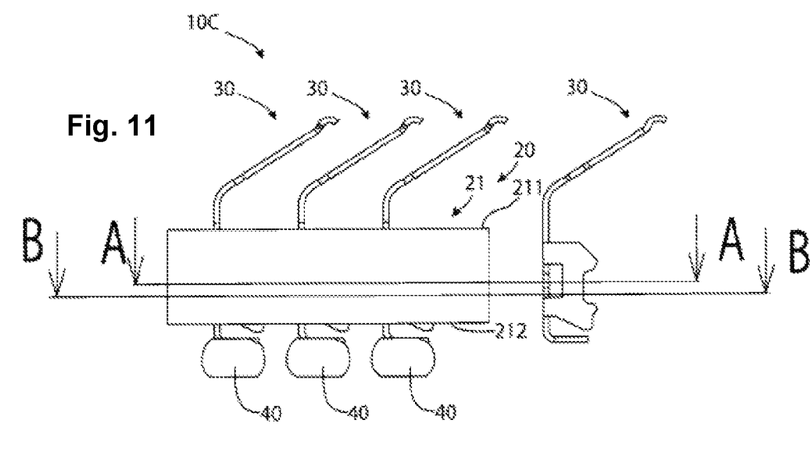
FIG. 11 is a side view of an IC socket according to another embodiment.
Figure 12A:
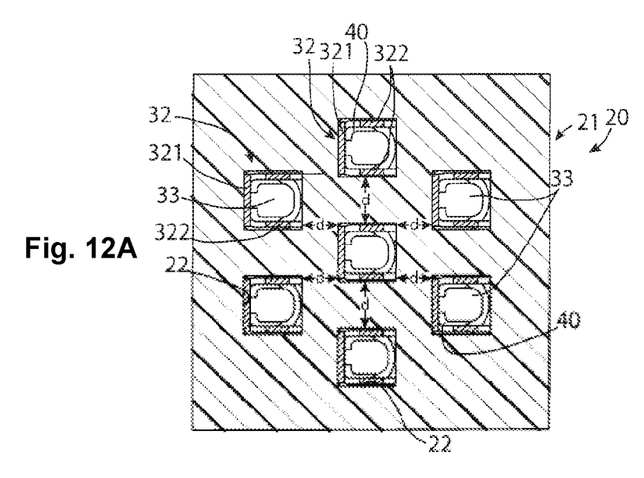
FIG. 12A is a sectional top view of the IC socket, taken along line A-A of FIG. 11.
Figure 12B:
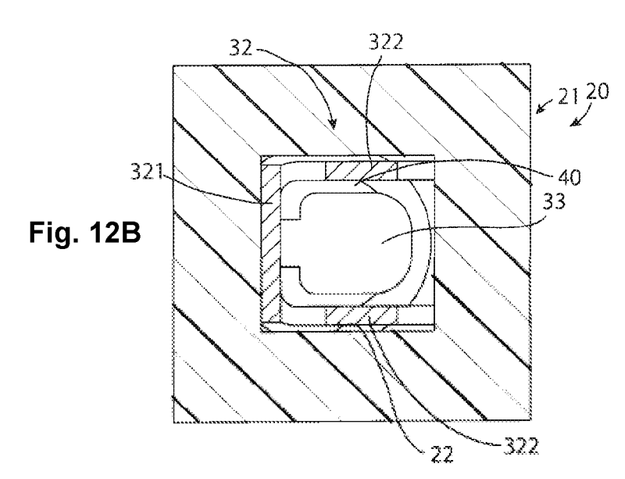
FIG. 12B is an enlarged portion of FIG. 12A.
Figure 13A:
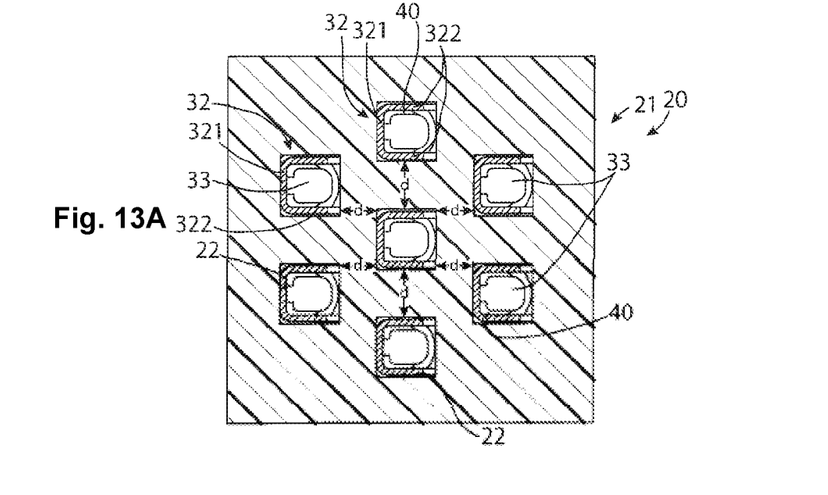
FIG. 13A is a sectional top view of the IC socket, taken along line B-B of FIG. 11.
Figure 13B:
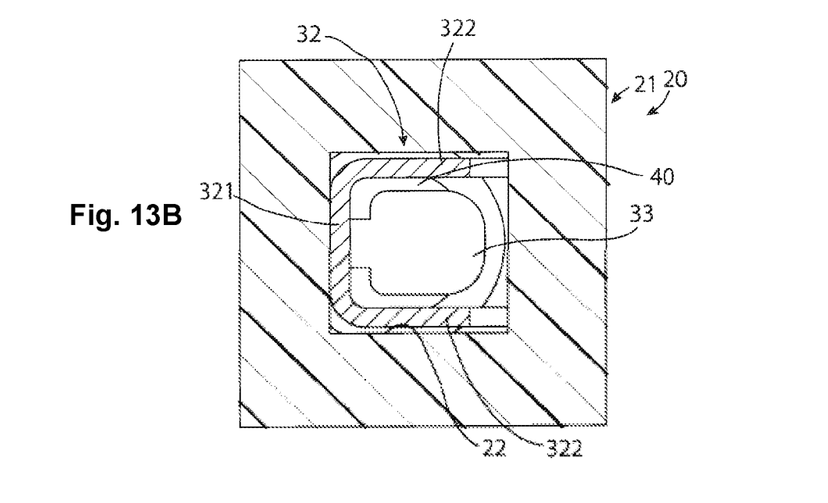
FIG. 13B is an enlarged portion of FIG. 13A.

As shown in FIGS. 10A and 10B, the retained portion 32 is inserted into a passageway 22 disposed in the flat plate portion 21 of a housing 20, and retained in the flat plate portion 21 by press-fit. The retained portion 32 includes a base portion 321 having a flat-plate shape, and a pair of side portions 322. The pair of side portions 322 extend at a substantially right angle with respect to the base portion 321 on each of both sides of the base portion 321. As a result, a cross section of the base portion 321 and the pair of side portions 322 in the retained portion 32 in a direction parallel to the first surface 211 of the flat plate portion 21 of the housing 20 has a roughly U-shape.

In the case of the first embodiment and second embodiment described above, the pair of side portions 322 extend at an angle obtuse with respect to each other from the base portion 321. The pair of side portions 322 are elastically deformed to extend substantially perpendicularly from the base portion 321 by being inserted into the passageway 22. In contrast, in the embodiment shown in FIGS. 10A-13B, the pair of side portions 322 extend perpendicularly from the base portion 321 after the state of the independent contact 30 prior to being inserted (press-fitted) into the passageway 22. This is because the retained portion 32 of the contact 30 of the third embodiment is press-fitted into the passageway 22, and therefore, the spring force of the side portions 322 is unnecessary. Moreover, press-fit projections 322b and 322c for enabling leading ends extend from the base portion 321 to be press-fitted into the passageway 22, as shown in FIGS. 12A-23B, are formed in each of the pair of side portions 322.

A slit 323 is also formed between the base portion 321 and each of the pair of side portions 322 in the retained portion 32 of the contact 30, as shown in FIGS. 10A and 10B. The slits 323 are not intended to adjust the spring force of the side portions 322. The slits 323 are intended to facilitate bending of the side portions 322 at an accurate angle with respect to the base portion 321.

As shown in FIGS. 10A and 10B, the contact beam 31 of the contact 30 extends, from the base portion 321 through a wide portion 312, obliquely with respect to the first surface 211 of the flat plate portion 21 of the housing 20. The contact beam 31 has a width decreasing approaching the obliquely extending end thereof, and includes a contact portion 311, which comes into contact with an IC, in the leading end. The wide portion 312 includes a carrier-cut portion 313 at a position adjacent to the contact beam 31. The carrier-cut portion 313 is disposed in the wide portion 312 with relatively high rigidity, and therefore facilitates breaking-off of a carrier (not shown). An opening 314 which is generally rectangular is formed in the center of the wide portion 312. A lower edge 315 of the opening 314 is a surface pressed by a press-fitting jig (not shown) when the contact 30 is press-fitted into the passageway 22.

As shown in FIGS. 11-13B, the passageways 22 disposed in the flat portion 21 of the housing 20 have a rectangular cross section. In the first embodiment and second embodiment described above, the passageways 22 are formed by drilling working into the substrate. Therefore, the passageways 22 have a circular cross section. In contrast, the housing 20 is formed by injection molding in the embodiment shown in FIGS. 11-13B; passageways 22 having any of a circular or rectangular shape are possible. In such a case, the passageways 22 are for use in press-fitting of the retained portion 32 of the contact 30, and need not have a circular shape. Thus, in such a case, the passageways 22 having a rectangular cross section are formed to fit the shape of the retained portion 32 having a cross section roughly having a U-shape.

When the retained portion 32 of this contact is press-fitted into the passageway 22, as shown in FIGS. 11-13B, the press-fit portions 322b and 322c in the leading ends of the side portions 322 are interlocked with the inner wall of the passageway 22, and the base portion 321 is strongly pressed on one surface of the inner wall of the passageway 22. As a result, the retained portion 32 is stably retained in the passageway 22. The formation of the retained portion 32 to roughly have a U-shape allows distances d from surroundingly existing contacts 30 to be uniform regardless of directions, in comparison with a contact including a retained portion having a merely flat-plate shape, thereby enabling high-speed signal transmission.

The retained portion 32 of the contact 30 is press-fitted due to the interlocking of the press-fit portions 322b and 322c with the inner wall of the passageway 22. In contrast, in the case of the embodiment shown in FIGS. 11-13B, the press-fitting is not performed in the direction of extending the base portion 321 (the direction orthogonal to the direction of protrusion of the press-fit portions 322b and 322c). Thus, projections 324 in a pair illustrated in FIGS. 12A and 12B may be allowed to be projections having a length allowing protrusion outward from the side portions 323 in the formation of the slits 323, and be interlocked with the inner wall of the passageway 22, thereby performing still firmer press-fitting. Alternatively, the retained portion 32 need not include the slits 323 when press-fitting by the press-fit portions 322b and 322c is sufficient.

The contact beam 31 of the contact 30 shown in FIGS. 10A and 10B has a width decreasing with approaching the end. However, a contact 30 having a retained portion 32 having such a configuration that press-fitting is performed as in the third embodiment may include a contact beam 31 having a uniform width, like the second embodiment and the alternative example thereof.

What is claimed is:

1. An integrated circuit (IC) socket, comprising:
   a housing having a flat plate portion; and
   a plurality of contacts disposed in the housing, the contacts each have a contact beam projecting outwardly from a first surface of the housing and a retained portion disposed in a passageway in the flat plate portion, the contact beam extends from the retained portion, the retained portion has a base portion with a flat-plate shape and a pair of side portions extending at an angle with respect to the base portion on a pair of opposite sides of the base portion, the side portions being elastically deformed in the passageway and pressed in a direction toward each other by an inner wall surface of the passageway, a cross-section of the retained portion parallel to the first surface has a U-shape.

2. The IC socket of claim 1, wherein the contacts are in contact and electrically connected with an IC facing the first surface of the flat plate portion.

3. The IC socket of claim 1, wherein the retained portion has a first slit between the base portion and each of the pair of side portions.

4. The IC socket of claim 1, wherein an end of each of the side portions and a pair of ends of the base portion in the cross-section contact the inner wall surface.

5. The IC socket of claim 1, wherein the retained portion is retained in the passageway by a press fit.

6. The IC socket of claim 2, wherein the contact beam extends obliquely with respect to the first surface.

7. The IC socket of claim 6, wherein a leading end of the contact beam has a contact portion adapted to contact the IC.

8. The IC socket of claim 7, wherein a portion of the contact beam excluding the leading end has a uniform width.

9. The IC socket of claim 8, wherein the contact beam has a pair of sub-beams.

10. The IC socket of claim 9, wherein a second slit is disposed between the sub-beams.

11. The IC socket of claim 10, wherein the contact beam has a crossbeam dividing the second slit.

12. The IC socket of claim 11, wherein the crossbeam links the sub-beams in an intermediate position along a direction of extension of the contact beam.

* * * * *